United States Patent [19]

Musemeci

[11] Patent Number: 4,800,416
[45] Date of Patent: Jan. 24, 1989

[54] BIPOLAR POWER TRANSISTOR HAVING BYPASSABLE INCORPORATED-BASE BALLAST RESISTANCE

[75] Inventor: Salvatore Musemeci, Giarre, Italy

[73] Assignee: SGS-ATES Componenti Elettronici S.p.A., Agrate Brianza, Italy

[21] Appl. No.: 608,084

[22] Filed: May 8, 1984

[30] Foreign Application Priority Data

May 16, 1983 [IT] Italy ................................. 6613 A/83

[51] Int. Cl.$^4$ ........................................... H01L 29/72
[52] U.S. Cl. ........................................... 357/34; 357/86
[58] Field of Search .................................. 357/86, 34

[56] References Cited

U.S. PATENT DOCUMENTS 3,860,460  1/1975  Olson ................................. 148/186

FOREIGN PATENT DOCUMENTS 1482803  9/1974  United Kingdom .

Primary Examiner—Martin H. Edlow
Attorney, Agent, or Firm—Wenderoth, Lind & Ponack

[57] ABSTRACT

The ballast resistance of the base of a bipolar power transistor is realized by a localized pinching of the base region by means of a special diffused region. A surface metallization brings the diffused region into contact with the adjacent base region so that a diode is formed in parallel with the base ballast resistance. The diode becomes conductive when the voltage drop across the resistance which is generated by the base current of the transistor exceeds the conduction threshold of the junction, thereby bypassing the ballast resistance.

3 Claims, 3 Drawing Sheets

BIPOLAR POWER TRANSISTOR HAVING BYPASSABLE INCORPORATED-BASE BALLAST RESISTANCE

BACKGROUND OF THE INVENTION

The present invention relates to a semiconductor device and, more particularly, to a bipolar power transistor.

It is well known in the art that the maximum power that can be dissipated from a bipolar transistor for a given collector-emitter voltage, without causing its failure defines the safe operating area or S.O.A.

It is also well known that, under operating conditions of a bipolar transistor with relatively high voltage values, a phenomenon arises which is known as forward biased secondary breakdown or $I_{s/b}$ which consists in a focusing of the collector current. If such a phenomenon is triggered, the temperature of the junctions increases without limit, causing a temperature derating and eventual transistor failure. Therefore, one is forced to limit the maximum power that can be dissipated by the transistor. In other words, the safe operating area of the transistor is reduced in order to avoid the phenomenon described above.

Various measures can be adopted in an attempt to limit the negative effects attributable to the $I_{s/b}$ and thereby to broaden the S.O.A. Particularly known among these measures is the use of ballast resistors in series with the base or with the emitter, or with both; these resistors, since they tend to uniformly distribute the current over the entire base-emitter junction, initiate a reaction which is adverse to the $I_{s/b}$ phenomenon and, therefore, stabilize the device, enabling it to operate safely at higher power levels.

However, the ballast resistances both in the emitter circuit and in the base circuit cannot be increased above a certain limit, especially in order not to deleteriously affect the saturation voltage of the transistor. Therefore, when designing a power transistor, it is necessary to arrive at the best compromise possible between these two opposing requirements, dependent upon the applications of the device.

From the constructional point of view, in order to design ballast resistors in the base circuit that are inherent in the structure of the transistor, it is necessary to utilize elevated layer resistances. A common method to obtain them consists in the pinching of the base, as exemplified by both British Patent No. 1,482,803 and U.S. Pat. No. 3,860,460. In this case, the diffusion of a region with an N-type conductivity in the base region having a P-type conductivity located around the emitter area creates an insulated PN junction between the emitter junction and the base contact of the transistor, which offers the advantage of substantially increasing the distributed resistance of the base, but which has the disadvantage, due to the high voltage drop across said resistor, of considerably increasing the base-emitter voltage $V_{BE}$ of the transistor for high base currents.

As mentioned above, a transistor with a high $V_{BE}$ is undesirable in many applications, for example, when the transistor is the final transistor of a pair of Darlington-connected transistors. In this case, the collector-emitter saturation voltage $V_{CEsat}$ which results from the sum of the collector-emitter saturation voltage of the input transistor and of the base-emitter voltage of the final transistor, is very high if the $V_{BE}$ of the final transistor is high.

SUMMARY OF THE INVENTION

A first object of the present invention is to not limit the value of the ballast resistance on the base of a bipolar power transistor so as to enable the S.O.A. of the transistor to be increased with respect to the phenomenon of the $I_{s/b}$.

A second object is to not adversely affect at the same time the voltage $V_{BE}$ or because of the elevated ballast resistance on the base.

Another object is to realize an extremely compact transistor structure which is easy to construct without the addition of further steps in the manufacturing process.

The above-noted objects may be achieved by providing a bipolar power transistor comprising: a semiconductor body including a collector region of a first type of conductivity; a base region with a second type of conductivity that is opposite to that of said first type of conductivity, said base region being arranged on said collector region so as to form a junction therewith and having one upper surface which is opposite to said collector region; an emitter region of said first type of conductivity which extends into said base region from said upper surface thereof so as to form a junction therewith; a first and a second and a third conductive means which respectively establish ohmic contacts with said collector and base and emitter regions; and an additional region of said first type of conductivity which extends into said base region from said upper surface thereof and forms therewith a junction delimiting a resistive path through said base region along the base-collector junction but outside of the emitter-collector path; a fourth conductive means which establishes an ohmic contact with said base region and with said additional region, said fourth conductive means being located on an upper surface on a part of said additional region which is closest to said emitter region.

BRIEF DESCRIPTION OF THE DRAWINGS

These and other objects of the present invention will become apparent from the ensuing detailed description of an illustrative embodiment given by way of non-limitative example in conjunction with the accompanying drawings, in which.

Like reference numerals refer to like parts throughout the several views.

DESCRIPTION OF THE PREFERRED EMBODIMENT

Figure 1:
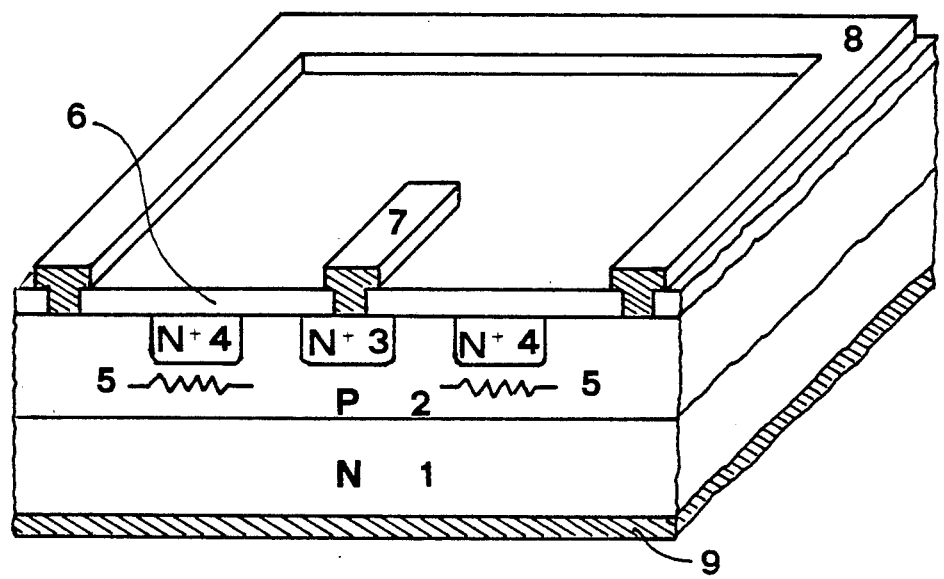
FIG. 1 is a non-scale cross-sectional view of a portion of a transistor of known construction.

Now, referring to FIG. 1 in which the simplified nonscale structure of a bipolar NPN-type power transistor is shown, in which 7, 8, 9 are the metal contacts of, respectively, the emitter, the base, and the collector.

The region 4 is diffused in order to create the high-value distributed ballast resistance of the base 5.

Figure 2:
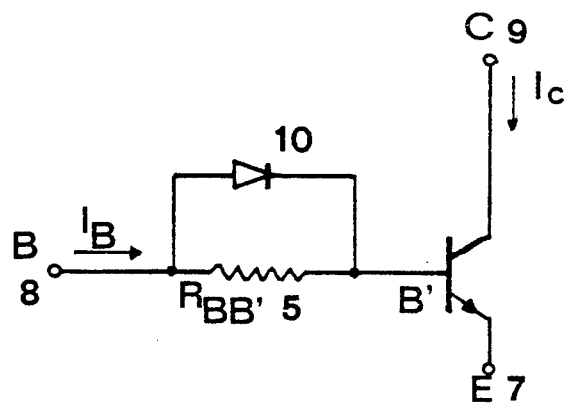
FIG. 2 is a schematic circuit diagram of the transistor embodying the principles of the present invention.

According to the present invention, the resistor 5 is bypassed, at a predetermined base current threshold $I_{B'}$ by a diode 10 illustrated in the schematic circuit diagram of FIG. 2. The operating threshold of the bypass diode 10 is provided by the threshold voltage of the PN junction forming the diode which, typically for silicon, is on the order of 0.6 V at ambient temperature.

Now, if the product $I_B \cdot R_{BB'}$ ($R_{BB'}$ being the overall base, resistance of the transistor) is such that it does not exceed the value 0.6 V, the bypass diode 10 is not operative (or operates in a negligible manner around the threshold value) while, as soon as the product $I_B \cdot R_{BB'}$ attains or exceeds the threshold value 0.6 V, said resistance $R_{BB'}$ denoted by the numeral 5 in the figures, is bypassed by the low resistance of the directly biased diode.

Figure 3:
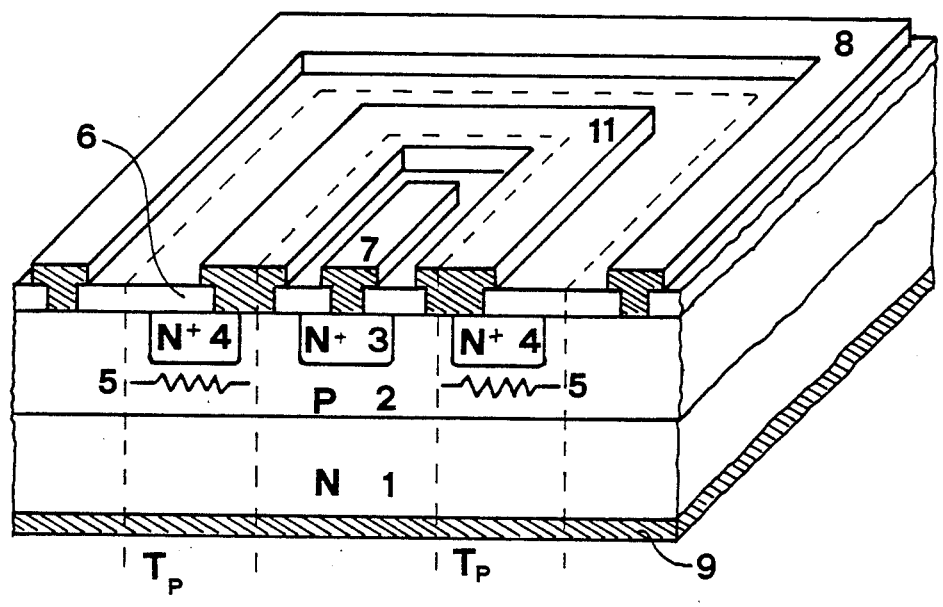
FIG. 3 is a non-scale cross-sectional view of a portion of a transistor of the same type as in FIG. 1 which has been modified according to the present invention.

A specific embodiment of the invention is depicted in FIG. 3. An examination thereof shows that the structure is subdivided into two parts by two broken lines; the structure in its entirety represents the transistor with its contacts for the emitter 7, the base 8, and the collector 9, while within said structure and, more particularly, within the zone defined between the two broken lines there is the distributed ballast resistance 5 produced by the pinching of the base region 2 on account of diffused region 4, and a parasitic transistor which, by means of its base-emitter junction, performs the function of the diode 10 in accordance with the mechanism described earlier. More particularly, it is proper to illustrate how the parasite transistor in FIG. 3 is realized. Inside the two broken lines and, more particularly, at the transition between the base region 2, underneath the distributed resistance 5 and the collector 1 there is provided a PN junction which forms the collector to base junction of the parasitic transistor. At the transition between the base region 2 and region 4 a PN junction is also provided which forms the base to emitter junction of the parasitic transistor. The regions 2 and 4 of the transistor of the present invention are connected at the surface by a metallization 11 which surrounds that of the emitter 7 and lies above the line delimiting at the surface the region 4 from the part closest to the emitter region 3.

In the absence of the metallization 11, the emitter junction of the parasitic transistor $T_P$ when the transistor becomes operative, does not bias. Instead, because of the metallization 11, the potential of the emitter E' of the parasitic transistor $T_P$ is anchored to the potential of the intrinsic base B' of the transistor.

Figure 4:
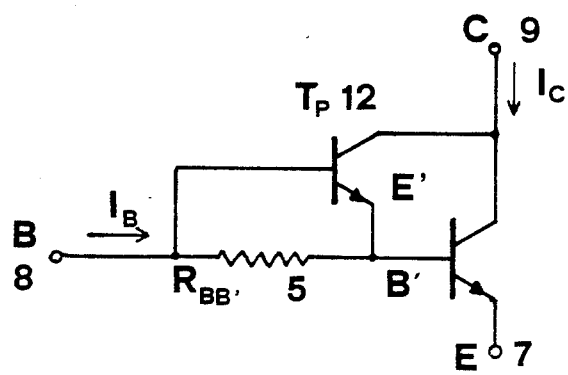
FIG. 4 is an equivalent diagram of the structure of the transistor of the present invention.

As a consequence, transistor of FIG. 3 can be represented by its equivalent circuit diagram in FIG. 4.

If one considers that during the operation of the transistor, the emitter-base junction of the parasitic transistor is always forward biased, whatever the biasing of the collector-base junction of the parasitic transistor, it is seen how the wiring diagram of FIG. 4, from the fundamental point of view, is electrically equivalent to those of FIG. 2 illustrated above.

At this point, disregarding the mathematical formulations of the calculations as they are known to those skilled in the art, and reasoning in terms of mean values, it is seen, for example, that if $R_{BB'}=10$ ohm, then $I_B = V_{BE}/R_{BB'} = 0.6/10 = 60$ mA, and if the transistor has a typical gain of $h_{FE}=40$, then $I_C = h_{FE} \cdot I_b = 40(0.06) = 2.4$ A, i.e., an $R_{BB'}=10$ ohm will be effective only up to said current values. Above said current values, the $R_{BB'}$ is bypassed by the forward biased junction of the parasitic transistor, whose value with such currents is much lower by far.

Therefore, the following advantages are achieved by the invention:

(1) The $V_{BB}$ of the transistor is not deleteriously affected in the sense that above the threshold value indicated earlier, as the $I_B$ increases, the voltage drop $R_{BB'} \cdot I_b$, which has a decisive influence upon the $V_{BE}$, is no longer a contributing factor.

Figure 5:
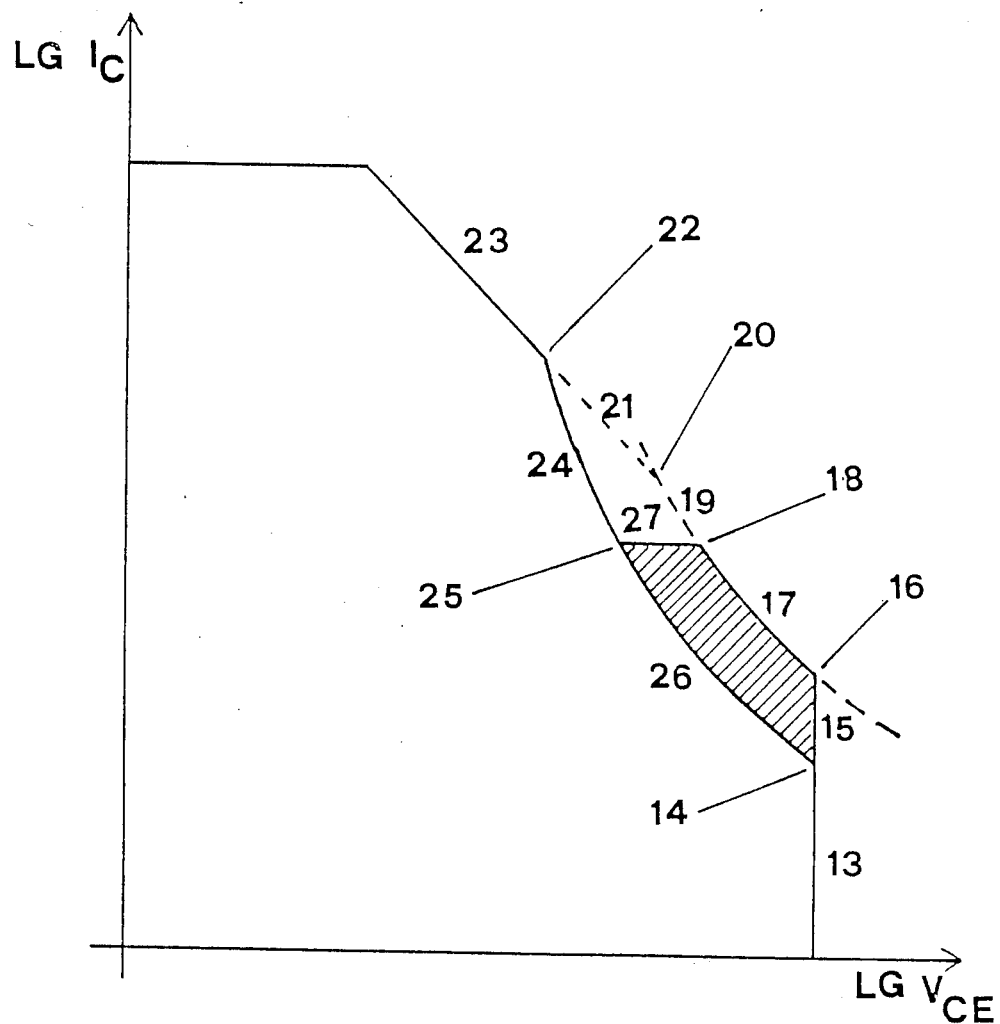
FIG. 5 shows the S.O.A. of the transistor of FIG. 1 and the improved S.OA. of the transistor of the present invention.

(2) The safe operating area (S.O.A.) of the transistor in the zone affected by the phenomenon of the forward biased secondary breakdown ($I_{s/b}$) is increased considerably and accurately by the quantity indicated by the broken line in FIG. 5.

The graph in FIG. 5 is very general and is useful for explaining the advantages of the invention. The transistor designed in accordance with today's technologies has an S.O.A. which is limited, as regards the $I_{s/b}$, with regard to by the solid curve segment 24–26. Said S.O.A. can be increased by inserting a ballast resistor in series with the base and in this case the S.O.A. shifts and is limited by the continuous graph line 19–17, but with the considerable disadvantage that it has a high $V_{BE}$ of the transistor as a result.

The transistor modified according to the teachings of the invention has the S.O.A. delimited by the graph lines 24–27—17–15; where the transition from the conditions of high to conditions of low ballast resistance of the base, i.e., from point 18 to point 25 through the horizontal line 27, is due to the action of the bypass diode. In this case, it is clear that the S.O.A. of the transistor modified according to the principles of the present invention is increased because, until the bypass diode of the transistor becomes operative, the transistor uses a very high $R_{BB'}$. The operation of the bypass diode prevents a detrimental effect on the $V_{BE}$ of the transistor for current values higher than those defined by the horizontal line 27.

(3) In addition in the structure of the transistor of FIG. 3, as can be seen from its electric equivalent in FIG. 4, the parasitic transistor $T_p$ forms the input transistor of a Darlington pair connection and, thus, as a further advantage of the present invention, if the gain $h_{FE'}$ of the parasitic transistor is greater than one, the Darlington effect appears so as to result in an increased total gain.

Summing up, by means of the already known design criteria and the measures described above, which are characteristic of the present invention, a bipolar power transistor is provided that does not have the drawbacks of the prior art which are due to the limitations imposed upon the base ballast resistance, thereby allowing, without increasing the production cost, a far better utilization of the transistor under high current and voltage con- ditions.

While only one specific embodiment of the present invention has been illustrated and described herein, it will be understood that numerous variations and modifications can be made without departing from the scope of the invention.

For example, with reference to FIG. 3, the metallization 11 must not necessarily follow in continuous manner the contour of the junctions between the regions 2 and 4 from the part closest to the emitter region 3, but it can be realized in a discontinuous manner, on condition that an ohmic contact be established between the same regions 2 and 4 in at least one point.

What is claimed is:

1. A bipolar power transistor comprising: a semiconductor body including a collector region of a first type of conductivity; a base region with a second type of conductivity that is opposite to that of said first type of conductivity, said base region being arranged on said collector region so as to form a junction therewith and having one upper surface which is opposite to said collector region; an emitter region of said first type of conductivity which extends into said base region from an upper surface thereof so as to form a junction therewith; a first and a second and a third conductive means which respectively establish ohmic contacts with said collector and base and emitter regions; and an additional region of said first type of conductivity which extends into said base region from said upper surface thereof and forms therewith a junction delimiting a resistive path through said base region along the base-collector junction but outside of the emitter-collector path; a fourth conductive means which establishes an ohmic contact with said base region and with said additional region, said fourth conductive means being located on said upper surface on a part of said additional region which is closest to said emitter region.

2. A transistor as set forth in claim 1, wherein said fourth conductive means comprises a continuous metal layer.

3. A transistor as set forth in claim 1, wherein said fourth conductive means comprises a metal layer which is discontinuous and which is in ohmic contact with said base region and with said additional region at one or more non-contiguous points therebetween.

* * * * *